United States Patent

Ravanelli et al.

[11] Patent Number: 6,060,758
[45] Date of Patent: May 9, 2000

[54] METHOD AND DEVICE FOR SUPPRESSING PARASITIC EFFECTS IN A JUNCTION-ISOLATION INTEGRATED CIRCUIT

[75] Inventors: Enrico Maria Ravanelli, Monza; Massimo Pozzoni; Giorgio Pedrazzini, both of Pavia; Giulio Ricotti, Broni, all of Italy

[73] Assignee: SGS-Thomson Microelectronics S.r.l., Agrate Brianza, Italy

[21] Appl. No.: 08/976,863

[22] Filed: Nov. 24, 1997

[30] Foreign Application Priority Data

Sep. 12, 1996  [EP]  European Pat. Off. .............. 96830614

[51] Int. Cl.[7] .......................... H01L 29/00; H01L 29/76; H01L 29/94; H01L 31/062
[52] U.S. Cl. .......................... 257/503; 257/373; 257/547
[58] Field of Search .................................. 257/373, 503, 257/547

[56] References Cited

U.S. PATENT DOCUMENTS

| | | | |
|---|---|---|---|
| 4,211,941 | 7/1980 | Schade, Jr. ............................. | 307/303 |
| 4,496,849 | 1/1985 | Kotowski ............................... | 307/254 |
| 4,949,142 | 8/1990 | Contiero et al. . | |
| 5,051,612 | 9/1991 | Agiman . | |
| 5,515,047 | 5/1996 | Yamakido et al. ..................... | 341/153 |
| 5,627,715 | 5/1997 | Brokaw ................................... | 361/93 |
| 5,687,067 | 11/1997 | Majid et al. ............................ | 363/97 |

FOREIGN PATENT DOCUMENTS

| | | | |
|---|---|---|---|
| 91830512 | 11/1991 | European Pat. Off. ...... | H01L 27/088 |
| 92203677 | 11/1992 | European Pat. Off. ........ | H01L 27/02 |
| 94830444 | 9/1994 | European Pat. Off. ........ | H01L 27/02 |

*Primary Examiner*—Mahshid Saadat
*Assistant Examiner*—Allan R. Wilson
*Attorney, Agent, or Firm*—Theodore E. Galanthay; Allen, Dyer, Doppelt, Milbrath & Gilchrist, P.A.

[57] ABSTRACT

A suppression method is applied to an integrated circuit formed on a substrate of p-type material having at least one region of n-type material with junction isolation, a first electrical contact on the frontal surface of the substrate, a second electrical contact on the n-type region and a third electrical contact on the back of the substrate connected to a reference (ground) terminal of the integrated circuit. To avoid current in the substrate due to the conduction of parasitic bipolar transistors in certain operating conditions of the integrated circuit, the method provides for monitoring the potential of the second contact to detect if this potential departs from the (ground) potential of the reference terminal by an amount greater than a predetermined threshold value. If this occurs the first contact is taken to the potential of the second contact, otherwise they are held at the (ground) potential of the reference terminal. A device and an integrated circuit which utilize the method are also described.

20 Claims, 2 Drawing Sheets

METHOD AND DEVICE FOR SUPPRESSING PARASITIC EFFECTS IN A JUNCTION-ISOLATION INTEGRATED CIRCUIT

FIELD OF THE INVENTION

The present invention relates to junction-isolating integrated circuits and, more particularly, to a method and a device for suppressing parasitic effects in an integrated circuit.

BACKGROUND OF THE INVENTION

In junction-isolated integrated circuits, transient biasing conditions can occur during operation such as to cause the passage of unwanted currents in the substrate of the integrated circuit and within the regions thereof isolated from one another by reverse biased p-n junctions. These currents are due to parasitic transistors becoming conductive. The transient biasing conditions mainly occur upon commutation of inductive loads, such as inductances and motors, or capacitive loads, such as capacitors, batteries and accumulators, effected by means of electronic switches of the integrated circuit.

A typical example of integrated circuit in which parasitic effects of this type occur is a driver circuit for inductive loads, for example, a transistor bridge. Such a circuit is shown in FIG. 1 connected between terminals, indicated +Vcc and the ground symbol, of a dc supply voltage source, which controls a motor M. In this example the transistors, indicated M1–M4 are power transistors of DMOS type, that is, double diffusion MOS field-effect transistors. Each of these transistors has a diode Db1–Db4 intrinsic in its structure, and which acts as a recovery diode. However, a bipolar transistor bridge with reversed diodes between the emitter and collector terminals could be used equally well to describe the parasitic phenomena caused in the integrated circuit by the switching of the inductive load.

As is known, a transistor bridge circuit is controlled in such a way that the transistors in the diagonals of the bridge are alternatively conductive and switched off so that currents in opposite senses are applied successively to the load. The parasitic effects described above occur during switching. Consider, for example, the instant at which the conduction of the transistors M1 and M2 is interrupted before activation of the transistors M3 and M4. In these conditions the energy stored in the inductive load M causes overvoltage in both senses on the output terminals of the bridge to which the load is connected. In particular, the source terminal S of the transistor M2 goes to a voltage greater than that of the supply voltage Vcc and the drain terminal D of the transistor of M1 goes to a lower voltage than ground so that the recovery diodes Db1 and Db2 associated with the transistors M1 and M2 both become conductive.

The effects of the positive overcurrent on the source terminal of M2 are described in relation to FIG. 2. The transistor M2 is formed on a substrate 10 of monocrystalline silicon doped with impurities of p-type, namely in a region 11 doped with n-type impurities delimited by a major or frontal surface of the substrate 10, a buried region 12 strongly doped with n-type impurities and therefore indicated n+, and an isolation region 13 strongly doped with p-type impurities, therefore indicated p+. The buried region 12 and the isolation region 13 form, with the substrate 10 and the region 11 respectively, a pn junction which, in normal operation of the integrated circuit, is reversed biased and electrically isolates the region 11 from the substrate 10. The region 11 provides the drain region of the transistor and has, on a frontal surface, a region 14 strongly doped with n-type impurities and a first metal contact electrode 14' which provides the drain terminal D. A p-type region 15 is formed within the n-type region 11 and provides the body region of the transistor.

A region 9 strongly doped with n-type impurities is formed within the body region 15 and provides the source region of the transistor. A second metal contact electrode 16 is formed on the frontal surface in contact with the source and body regions and constitutes the source terminal S. The source region 15 delimits a channel 17 with the edges of the body region 15. The channel 17 is overlain by a third electrode indicated 18, isolated from the frontal surface by a gate dielectric (not shown) which provides the gate terminal G of the transistor.

In the drawing there is also shown another n-type region, similar to the drain region 11 of the transistor M2, and indicated 11', isolated by a buried region 12' and a junction-isolation region 13', able to contain another DMOS transistor or other components of the integrated circuit. The isolation regions 13 and 13' of the two n-type regions 11 and 11' delimit a portion 19 of the substrate able to contain other components of the integrated circuit, not shown, for example the control circuits of a DMOS transistor bridge. In this portion of the substrate 10 there is only shown a region 20 strongly doped with p-type impurities which has a metal contact electrode 21 on its surface. This electrode, in the example shown, is intended to connect to a ground terminal, that is, a voltage reference terminal common to all the integrated circuit.

On the other major surface, or back, of the substrate 10 there is also provided a metal contact electrode 8 which is connected to ground. In general, the integrated circuit in the substrate 10 will have several n-type regions, such as the regions 11 and 11' isolated from the substrate by isolation regions such as the regions 13 and 13'.

The body region 15 and the drain region 11 define between them a pn junction which provides the recovery diode Db2 of the transistor M2 in the bridge of FIG. 1. Moreover, the body region 15, the drain region 11 and the substrate 10 define, respectively, the emitter, base and collector regions of a bipolar pnp transistor, represented by its circuit symbol and indicated Qp2 in FIG. 2.

The transient situation described above, that is, where the source terminal of the transistor M2 is at a higher potential then that of the supply Vcc and the diode Db2 is forward biased, is symbolised by a current generator 22 which injects a current, the recirculation current, into the source terminal S of the transistor M2. In this situation the base-emitter junction of the parasitic transistor Qp2 is also forward-biased so that the transistor Qp2 is conductive and a current is injected into the substrate. Because of the distributed resistance of the substrate, represented by two resistors Rsub1 and Rsub2 in FIG. 2, this current causes a localized rise in potential within the substrate with respect to the ground potential. This can cause disturbances in the operation of the integrated circuit, in particular in the parts in which small signals are processed.

The ground contact formed by means of the region 20 and the electrode 21 provides a known approach for significantly reducing this effect. In practice the effect of the ground contact on the frontal surface is to divide the distributed resistance of the substrate, which is represented by a potential divider formed by two series resistors Rsub1 and Rsub2, the intermediate tap of which is connected to the ground contact 20, 21.

The effects of the negative overvoltage on the drain terminal D of transistor M1 are described in relation to FIG. 3. The structure of the transistor M1 is identical of that of the transistor M2 of FIG. 2 and therefore the corresponding elements are indicated with the same reference numerals. In the drawing various n-type regions, indicated 11" have been shown, similar to the region 11 able to contain other DMOS transistors or different components of the integrated circuit, and a strongly doped p-type region 20 with an ground contact electrode 21 which has the function described above in relation to FIG. 2. The drain region 11 of the transistor M1 provides the emitter region of a parasitic bipolar npn transistor Qp1 the base of which is distributed within the interior of the substrate 10, and, therefore, extends over the whole of the integrated circuit and has various collectors constituted by the various n-type regions 11".

The transient situation described above, that is, wherein the drain terminal D of the transistor M1 is at a lower potential than ground potential and the diode Db1 is forward biased, is symbolised by a current generator 23 which extracts current, the recirculation current, from the drain terminal D of the transistor M1. In this situation the base-emitter junction of the parasitic transistor Qp1 is also forward biased and part of the recirculation current passes through it and is collected in part by the frontal ground contact and by that on the back of the substrate, and, in part (Icp) by the n-type regions 11" which provide the collectors of the transistor Qp1. It can be shown that the ground contacts, especially those on the front, have the effect of increasing the efficiency of the transistor Qp1 and therefore the current Icp collected by the n-type regions 11". To avoid this effect it would be necessary to eliminate the ground contact on the frontal surface, but this would also involve giving up the reduction in the damaging effects of the pnp transistor Qp2 during overvoltages as described above in relation to FIG. 2.

SUMMARY OF THE INVENTION

In view of the foregoing background, it is an object of the present invention to provide a method and a device for suppressing or at least strongly attenuating the effects of both pnp and npn parasitic transistors in a junction-insulating integrated circuit.

This object is achieved in accordance with the present invention by a method for suppressing parasitic effects in an integrated circuit formed on a substrate of semiconductor material of a first conductivity type comprising at least one region of a second conductivity type delimited by a first major surface of the substrate and by junction-isolation regions, first electrical contact means with the substrate on the first major surface, second electrical contact means on the region of second conductivity type, and third electrical contact means on a second major surface of the substrate, opposite the first major surface, connected to a potential reference terminal of the integrated circuit. The method preferably comprises the steps of:

monitoring a potential of the second electrical contact means to detect if this potential departs from the potential of the reference terminal by an amount greater than a predetermined threshold value; and holding the first electrical contact means to the potential of the reference terminal or to the potential of the second electrical contact means based upon, respectively, whether the monitored potential does not or does depart from the potential of the reference terminal by an amount greater than the predetermined threshold value.

The invention also relates to a device and integrated circuit for carrying out the method described above.

BRIEF DESCRIPTION OF THE DRAWINGS

The invention will be better understood from the following detailed description of an embodiment, given by way of non-limitative example, in relation to the attached drawings, in which.

DETAILED DESCRIPTION OF THE PREFERRED EMBODIMENTS

Figure 3:
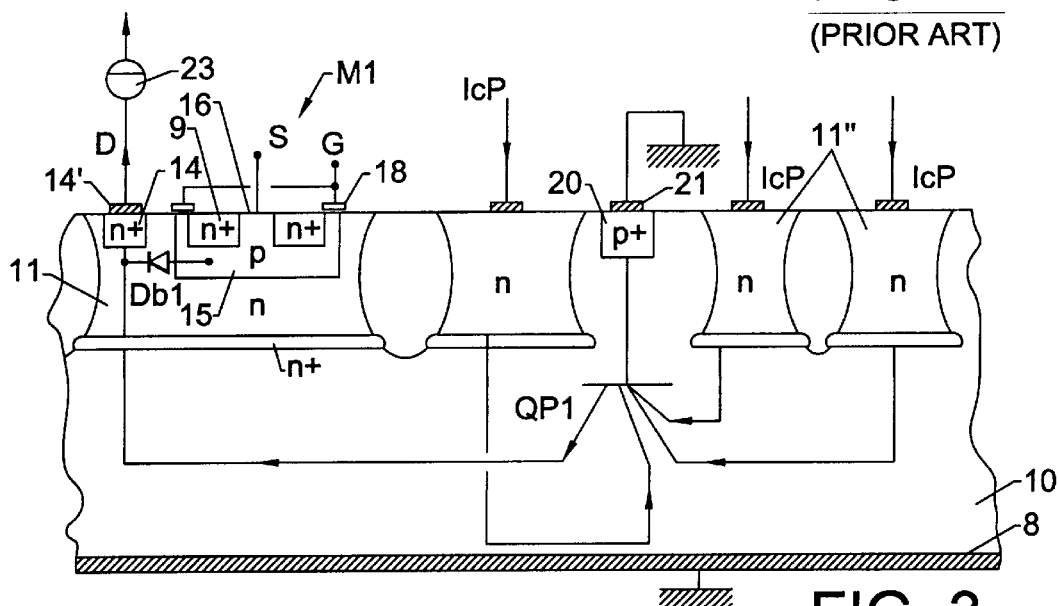
Figure 4:
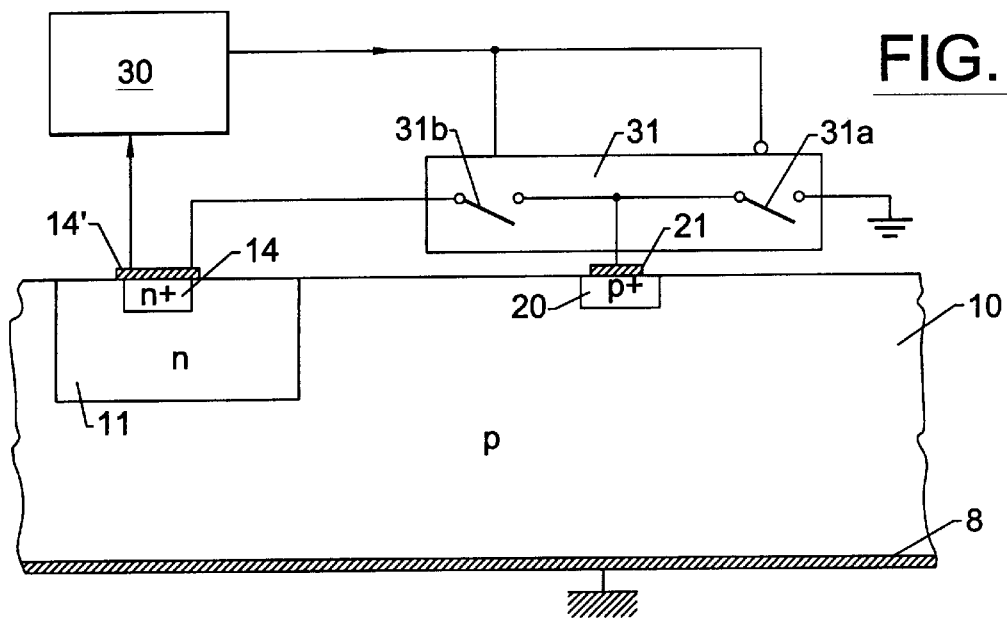
FIG. 4 is a block diagram useful for illustrating the method and principle of operation of a device according to the invention.

FIG. 4 schematically illustrates a portion of the integrated circuit of the type shown in FIG. 3, that is to say comprising an n-type region again indicated 11 in a p-type substrate 10, electrical contact means, again indicated 20 and 21, on the frontal surface of the substrate 10 and grounded contact means 8 on the back surface of the substrate. There are also provided a monitoring and detection circuit 30 and a control circuit unit 31 which, preferably, are formed on the same integrated circuit.

The unit 30 is operable to monitor the surface potential of the region 11 and to detect if this potential falls below a predetermined threshold value with respect to the ground terminal, which is considered to be the common reference potential of the integrated circuit.

The unit 31 is connected to the output of unit 30, to the surface of region 11, to various contacts distributed over the frontal surface of the integrated circuit (only one shown in FIG. 4) and to a ground terminal. It functions in such a way as to connect the frontal surface contacts of the substrate with the contact terminal on the surface of the region 11 when the unit 30 detects a potential less than the ground potential in the above-indicated measurement and to the ground terminal otherwise. This function is symbolized by two switches 31a and 31b within the block 31.

Figure 2:
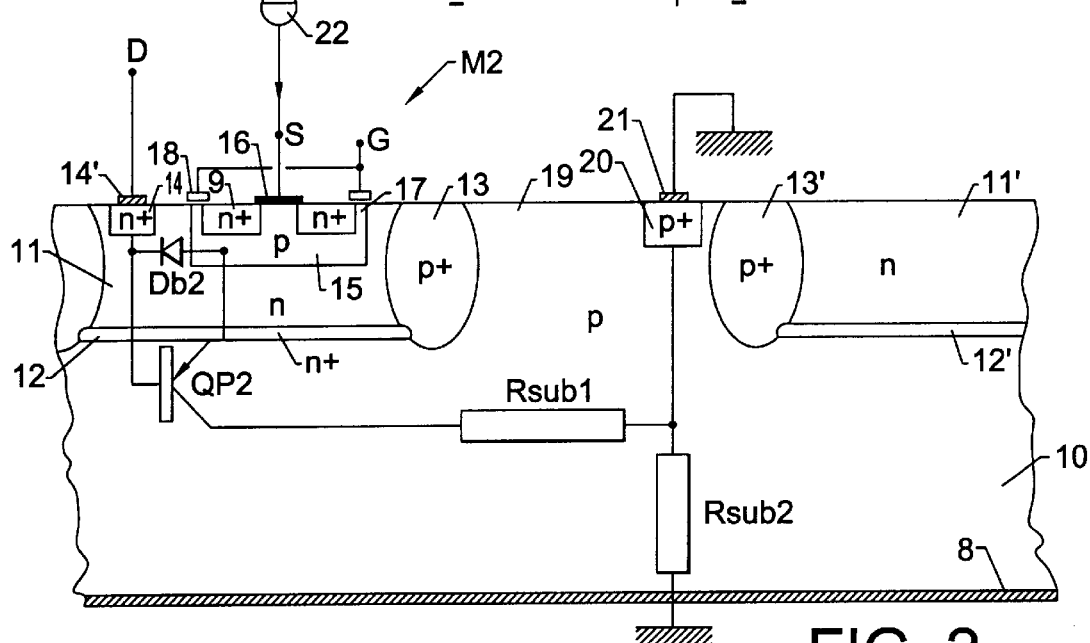
FIGS. 2 and 3 are sections through portions of an integrated circuit which show the structure of two transistors of the bridge of FIG. 1 and the parasitic bipolar transistor associated with it as in the prior art.

According to the invention, therefore, the p-type surface portion of the substrate 10 follows the surface potential of the region 11 below ground potential. This is also possible if the back surface is connected directly to ground due to the intrinsic resistivity of the substrate. It is clear that the parasitic npn transistor indicated Qp1 in FIG. 3 cannot become conductive in a structure such as that of FIG. 4, because base and emitter are always at the same potential. Moreover, as far as the parasitic pnp transistors, such as this indicated Qp2 in FIG. 2 are concerned, the current injected from them into the substrate can be reduced without problems with the known method described in relation to FIG. 2. Rather, when the positive overvoltage on the source terminal of the transistor M2 is contemporaneous with the negative overvoltage on the drain terminal of the transistor M1, the reduction in current injected into the substrate will be greater still in that the potential on the front surface of the substrate will be less than ground potential.

Figure 1:
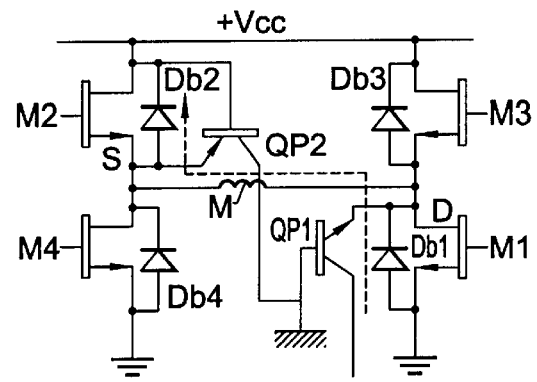
FIG. 1 is a circuit diagram of a transistor bridge with an inductive load, as in the prior art and useful for understanding the problem of the invention.
Figure 5:
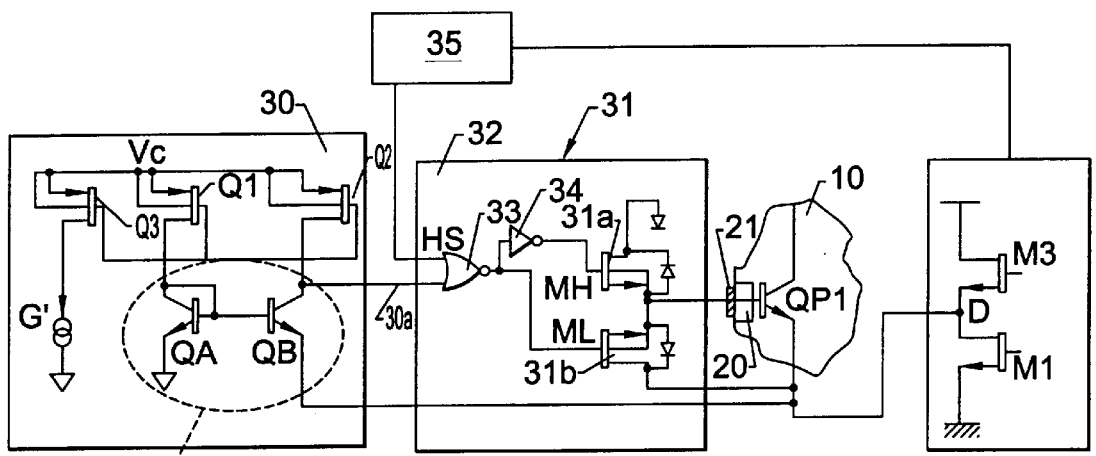
FIG. 5 is a circuit diagram which illustrates a preferred embodiment of the invention.

A practical embodiment of the device according to the invention applied in an integrated circuit including a transistor bridge, such as that of FIG. 1, is schematically shown in FIG. 5. Only one half of the bridge, that comprising the transistors M1 and M3, is shown in the drawing. The substrate 10 of the integrated circuit is represented by its surface portion containing a frontal contact 20, 21.

The monitoring and detection unit 30 is provided by a comparator which compares the potential present on the drain terminal of the transistor of M1 with the ground potential, and emits a signal on its output 30u when the potential of the drain terminal of the transistor M1 falls by an amount less than a predetermined level below the ground potential. The control unit 31 is provided by two MOS transistors of low conduction resistance type, indicated MH and ML and by a logic circuit 32. The source terminal of the two transistor MH and ML are connected together and provide the output terminal of the control unit which is connected to the surface contact 20, 21 of the substrate 10. The drain terminal of the transistor MH is connected to ground and that of the transistor ML is connected to the surface of the region 11.

The logic circuit 32 is provided by a NOR gate 33 having a first input connected to the output 30u of the comparator 30, and a second input connected to the control circuit 35 of the transistor bridge. Its output is connected directly to the gate electrode of the transistor ML and via an inverter 34 to the gate electrode of the transistor MH.

In the example shown the comparator 30 is provided by two bipolar npn transistors QA and QB having their bases connected in common and their collectors connected to one terminal of a power supply source Vc through respective current generators provided by two MOS transistor Q1 and Q2 connected in the manner shown to a third MOS transistor Q3, which, in turn, is connected in series with a generator G'. The inputs of the comparator 30 are provided by the emitters of the transistor QA and QB. The collector of the transistor QA is also connected to its base and the collector of the transistor QB provides the output of the comparator. The emitter of the transistor QA is connected to a second terminal of the voltage supply which is also connected to the ground of the integrated circuit.

The operation of the device will now be considered. The two transistors QA and QB are dimensioned in such a way that when the drain terminal of the transistor M1 is at ground potential the transistor QB is switched off. In addition when transistor M1 is at a lower potential than a given negative threshold level, such as, for example, 100 mV below the ground potential, the transistor QB is conductive. This negative threshold of the comparator can be fixed by forming the transistor QA with an emitter area about ten times larger than that of QB. Therefore the base-emitter voltage for conduction of QA ($V_{BE(QAon)}$) is lower than that of QB($V_{BE(QBO)}$) by an amount determined by the ratio between the emitter areas.

When QB is switched off the output of the comparator is high and therefore the output of the NOR gate 33 is low. Consequently the transistor ML is switched off and, by the effect of the inverter 34, the transistor MH is conductive. The contact 20, 21 on the front surface of the substrate is therefore connected to ground. If, however, the drain terminal of the transistor M1 falls below ground potential to a potential lower than the negative threshold of the comparator, Qb goes into conduction and the output of the comparator goes to the logic low level. In these conditions, if the second input of the NOR gate 33 is also at a low level the output of this gate will be high so that the transistor ML will be in conduction and the transistor MH will be switched off. Therefore, the contact 20, 21 will be at the same potential, lower than ground potential, as the surface of the region 11.

The function of the NOR gate 33 is to synchronize the operation of the control circuit 31 with that of the bridge control circuit 35. In particular it makes it possible to prevent the drain terminal of the transistor M1 from going positive when the transistor M3 is conductive during recirculation of current with the drain terminal of the transistor M1 below ground potential. In fact, because of the switching delay of the comparator 30, the transistor ML could still be conductive when the transistor M3 is conductive. This is prevented by the fact that when the triggering command is given to the transistor M3 a high level signal is applied to the input HS of the NOR gate 33 so that the output of the NOR gate is low and the transistor ML is deactivated.

A device such as that described above can be provided for each n-type region which can be brought to a lower potential than the ground potential. However the transistor MH can be common to all the devices.

Figure 6:
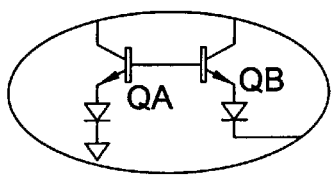
FIG. 6 shows a variant of a detail of the circuit of FIG. 5.

FIG. 6 shows a variant of the comparator 30 in which there is provided an arrangement for preventing the transistors QA and QB from being subjected to the high voltage which appears between the drain terminal of the transistor of M1 and ground at the end of the current recirculation due to the negative overvoltage on the transistor itself. The arrangement includes introducing in series with the emitters of the transistors QA and QB diodes having an adequate reverse conduction breakdown voltage.

Although a single embodiment of the present invention has been described it will be clear to a man skilled in the art that numerous modifications are possible within the ambit of the same incentive concept. For example, in place of the comparator 30 described other types of comparator could be used. Moreover, the method can be applied not only to an integrated circuit including a transistor bridge circuit for control of an inductive load, but also to other integrated circuits in all cases in which the above-described parasitic effects are manifest.

That which is claimed:

1. A device for suppressing parasitic effects in an integrated circuit formed on a substrate of semiconductor material of a first conductivity type, said device comprising:

junction isolation regions;

at least one region of a second conductivity type opposite the first conductivity type, delimited by first portions of a first major surface of the substrate and by said junction-isolation regions;

first electrical contact means with the substrate on second portions of the first major surface outside of said junction-isolation regions;

second electrical contact means on the at least one region of second conductivity type; and a reference terminal for the integrated circuit;

third electrical contact means on a second major surface of the substrate opposite the first major surface, being connected to the reference terminal of the integrated circuit;

first circuit means connected to said second electrical contact means for monitoring a potential thereof and for detecting if this potential departs from a potential of the reference terminal by an amount greater than a predetermined threshold value; and second circuit means connected to the first and second contact means and to the first circuit means for connecting the first electrical contact means to the reference terminal if the detected potential is within the predetermined threshold value, and connecting the first electrical contact means to the second electrical contact means if the detected potential is greater than or equal to the predetermined threshold value.

2. A device according to claim 1, wherein said first circuit means comprises a comparator having a first input terminal connected to the reference terminal, a second input terminal connected to the second electrical contact means, and an output terminal functionally connected to the second circuit means.

3. A device according to claim 2, wherein said comparator includes a circuit having first and second branches each including a transistor, and each connected to the other in a current mirror configuration, and wherein the first and second input terminals are connected to the first and second branches, respectively.

4. A device according to claim 1, wherein said second circuit means includes first and second electronic switches which can be activated by the first circuit means on respective control terminals, and which are respectively connected between the first electrical contact means and the reference terminal and between the first electrical contact means and the second electrical contact means.

5. A device according to claim 4, wherein the first and second electronic switches each comprise at least one transistor.

6. A device according to claim 1, wherein the first conductivity type is p, and the second conductivity type is n.

7. A device for suppressing parasitic effects in an integrated circuit formed on a substrate of semiconductor material of a first conductivity type, said device comprising:
   junction isolation regions;
   at least one region of a second conductivity type opposite the first conductivity type, delimited by first portions of a first major surface of the substrate and by said junction-isolation regions;
   first electrical contact means with the substrate on second portions of the first major surface outside of said junction-isolation regions;
   second electrical contact means on the at least one region of second conductivity type; and
   a reference terminal for the integrated circuit;
   third electrical contact means on a second major surface of the substrate opposite the first major surface, being connected to the reference terminal of the integrated circuit;
   a comparator connected to said second electrical contact means for monitoring a potential thereof and for detecting if this potential departs from a potential of the reference terminal by an amount greater than a predetermined threshold value; and
   second circuit means connected to the first and second contact means and to said comparator for connecting the first electrical contact means to the reference terminal if the detected potential is within the predetermined threshold value, and connecting the first electrical contact means to the second electrical contact means if the detected potential is greater than or equal to the predetermined threshold value.

8. A device according to claim 7, wherein said comparator has a first input terminal connected to the reference terminal, a second input terminal connected to the second electrical contact means, and an output terminal functionally connected to the second circuit means.

9. A device according to claim 8, wherein said comparator includes a circuit having first and second branches each including a transistor, and each connected to the other in a current mirror configuration, and wherein the first and second input terminals are connected to the first and second branches, respectively.

10. A device according to claim 7, wherein said second circuit means includes first and second electronic switches which can be activated by said comparator on respective control terminals, and which are respectively connected between the first electrical contact means and the reference terminal and between the first electrical contact means and the second electrical contact means.

11. A device according to claim 10, wherein the first and second electronic switches each comprise at least one transistor.

12. A device according to claim 7, wherein the first conductivity type is p, and the second conductivity type is n.

13. An integrated circuit on a substrate of semiconductor material of a first conductivity type comprising:
   a plurality of junction-isolation regions;
   a plurality of regions of a second conductivity type opposite the first, delimited by first portions of a first major surface of the substrate and by said junction-isolation regions;
   first electrical contact means with the substrate on second portions of the first major surface outside of said junction-isolation regions;
   second electrical contact means on at least one region of the second conductivity type;
   a voltage reference terminal;
   third electrical contact means on a second major surface of the substrate, opposite the first major surface, connected to said voltage reference terminal of the integrated circuit;
   at least in one region of the plurality of regions of second conductivity type including an electronic switch of a bridge circuit for control of an inductive load, and in which the second electrical contact means provides a first terminal of the electronic switch of the bridge circuit, and a second terminal of the electronic switch of the bridge circuit is connected to the reference terminal;
   first circuit means connected to said second electrical contact means for monitoring e potential thereof and for detecting if this potential departs from a potential of the reference terminal by an amount greater than a predetermined threshold value; and
   second circuit means connected to the first and second contact means and to the first circuit means for connecting the first electrical contact means to the reference terminal if the detected potential is within the predetermined threshold value, and connecting the first electrical contact means to the second electrical contact means if the detected potential is greater than or equal to the predetermined threshold value.

14. An integrated circuit according to claim 13, wherein said first circuit means comprises a comparator having a first input terminal connected to the reference terminal, a second input terminal connected to the second electrical contact means, and an output terminal functionally connected to the second circuit means.

15. An integrated circuit according to claim 14, wherein said comparator includes a circuit having first and second branches each including a transistor, and each connected to the other in a current mirror configuration, and wherein the first and second input terminals are connected to the first and second branches, respectively.

16. An integrated circuit according to claim 13, wherein said second circuit means includes first and second electronic switches which can be activated by the first circuit means on respective control terminals, and which are respectively connected between the first electrical contact means and the reference terminal and between the first electrical contact means and the second electrical contact means.

17. An integrated circuit according to claim 13, wherein the first and second electronic switches each comprise at least one transistor.

18. An integrated circuit according to claim 16, further comprising a control circuit for the bridge circuit.

19. An integrated circuit according to claim 18, wherein said first circuit means comprises a comparator having an output terminal; and further comprising a logic circuit between the output terminal of the comparator and control terminals of the first and second electronic switches connected to the control circuit of the bridge circuit to synchronize activation of the first and second switches with operation of the bridge circuit.

20. An integrated circuit according to claim 13, wherein the first conductivity type is p, and the second conductivity type is n.

* * * * *

UNITED STATES PATENT AND TRADEMARK OFFICE
CERTIFICATE OF CORRECTION

PATENT NO. : 6,060,758
DATED : May 9, 2000
INVENTOR(S) : Enrico Maria Ravanelli, Massimo Pozzoni It is certified that error appears in the above-identified patent and that said Letters Patent is hereby corrected as shown below:

On the title page:

[30] Foreign Application Priority Data

Delete: "Sept. 12, 1996 [EP] European Pat. Off. ...... 96830614"
Insert -- Dec. 9, 1996 [EP] European Pat. Off........96830614 --

Signed and Sealed this

Twenty-fourth Day of April, 2001

Attest:

NICHOLAS P. GODICI

Attesting Officer

Acting Director of the United States Patent and Trademark Office